(12) United States Patent
Kaewell, Jr.

(10) Patent No.: US 7,304,374 B2
(45) Date of Patent: *Dec. 4, 2007

(54) WIRELESS COUPLING OF SEMICONDUCTOR DIES

(75) Inventor: John David Kaewell, Jr., Jamison, PA (US)

(73) Assignee: InterDigital Technology Corporation, Wilmington, DE (US)

( * ) Notice: Subject to any disclaimer, the term of this patent is extended or adjusted under 35 U.S.C. 154(b) by 154 days.

This patent is subject to a terminal disclaimer.

(21) Appl. No.: 11/176,748

(22) Filed: Jul. 7, 2005

(65) Prior Publication Data

US 2005/0253225 A1 Nov. 17, 2005

Related U.S. Application Data

(63) Continuation of application No. 10/749,688, filed on Dec. 31, 2003, now Pat. No. 6,953,994.

(60) Provisional application No. 60/507,971, filed on Oct. 2, 2003.

(51) Int. Cl.
*H01L 23/02* (2006.01)
(52) U.S. Cl. ...................... 257/686; 257/728
(58) Field of Classification Search ............ 257/686, 257/777, 724–728, E21.51
See application file for complete search history.

(56) References Cited

U.S. PATENT DOCUMENTS

| 5,012,323 | A | 4/1991 | Farnworth |
| 5,593,927 | A | 1/1997 | Farnworth et al. |
| 6,169,329 | B1 | 1/2001 | Farnworth et al. |
| 6,207,474 | B1 | 3/2001 | King et al. |
| 6,376,909 | B1 | 4/2002 | Forbes et al. |

(Continued)

OTHER PUBLICATIONS

Gahagan et al., "RF (Gigahertz) ATE Production Testing On-Wafer: Options and Tradeoffs," IEEE, 1999 International Test Conference.

(Continued)

*Primary Examiner*—Nathan W. Ha
(74) *Attorney, Agent, or Firm*—Volpe and Koenig, P.C.

(57) ABSTRACT

At least one semiconductor die is equipped with at least one RF transmitter, RF receiver and/or RF transceiver. This enables one or more RF links to be established with the die, enabling communications with the die to be effected with reduced or no wirebond or other physical connections. In another aspect of the invention, a source die with RF communication capability communicates with a target die by establishing an RF link with an intermediate RF device. The intermediate RF device has a physical connection, either directly to the target die, or to the substrate which they share, which allows the source die to communicate with the target die. The source and target dies may be on the same or on different substrates. This enables the use of multiple semiconductor dies and substrates in a manner which reduces the required physical connections between them.

8 Claims, 1 Drawing Sheet

U.S. PATENT DOCUMENTS

| | | | |
|---|---|---|---|
| 6,682,955 B2 | 1/2004 | Cobbley et al. | |
| 6,706,557 B2 | 3/2004 | Koopmans | |
| 7,038,326 B2 * | 5/2006 | Poulin | 257/784 |
| 7,071,545 B1 * | 7/2006 | Patel et al. | 257/686 |
| 2002/0079567 A1 | 6/2002 | Lo et al. | |
| 2004/0084766 A1 | 5/2004 | Shieh et al. | |
| 2004/0104462 A1 | 6/2004 | Tao et al. | |
| 2004/0155327 A1 | 8/2004 | Cobbley et al. | |
| 2005/0068169 A1 * | 3/2005 | Copley et al. | 340/539.13 |
| 2006/0136755 A1 * | 6/2006 | Qawami et al. | 713/300 |

OTHER PUBLICATIONS

Stoukatch et al., "High Density 3-D Stack Structure for Sip Solutions," IMEC, Kapeldreef 75, 3001 Leuven, Belguim, Internet: http://www.imec.be.

Simon et al., "Interconnects and Transitions in Multilayer LTCC Multichip Modules for 24 GHz ISM-Band Applications," IEEE International Microwave Symposium (IMS-2000), Jun. 2000, pp. 1047-1050.

* cited by examiner

WIRELESS COUPLING OF SEMICONDUCTOR DIES

CROSS REFERENCE TO RELATED APPLICATIONS

This application is a continuation of U.S. patent application Ser. No. 10/749,688 filed Dec. 31, 2003 which in turn claims priority from U.S. Provisional Patent Application Ser. No. 60/507,971 filed Oct. 2, 2003, which are incorporated by reference as if fully set forth.

FIELD OF INVENTION

The present invention relates to semiconductor packaging and to stacked semiconductors. More particularly the invention relates to the interconnection of semiconductor dies in a stacked relationship, either within a single package or in discreet packages in a stacked or closely adjacent configuration.

BACKGROUND

One of the problems with stacked semiconductor dies is a requirement for interconnection. Typically such interconnection is achieved by wirebonding, because techniques used for direct bondpad-to-leadframe connections, such as flip chip and bump connections, are difficult to achieve in the situation of multiple dies. In addition, if a multi-chip module (MCM) is to be pre-characterized and tested, dies which are inoperative must be disconnected and then re-connected to the package substrate. In addition, the transfer of data at high speeds creates problems with respect to lead wires, in that the lead wires tend to have significant inductance, particularly at high frequencies. Accordingly, it is desired to provide a multi-chip module (MCM) in which communication is effected in a manner which bypasses the requirement for lead wires.

Another problem with stacked dies is that, if it is desired to communicate between the dies, then some form of a connection must be made between the dies. There are two ways to accomplish this: 1) direct interconnection from one die to another die; and 2) connection from one die to a lead frame or a connection on a package substrate and a second connection from the lead frame or substrate to a second die. In the case of a direct connection, it becomes necessary to provide wirebonding from die to die. In the case of an interconnection through the lead frame or substrate, a double connection is required, thereby a creating a potential for more signal loss. Accordingly, it is desired to provide a signal communications system for semiconductors in which multiple semiconductors in a vertically spaced relationship or in a closely-spaced relationship are able to communicate. It is further desired to reduce the number of internal connections for a semiconductor package, and if possible, not greatly exceed the lead count for the package.

SUMMARY

At least one semiconductor die is equipped with at least one RF transmitter, RF receiver and/or RF transceiver. This enables one or more RF links to be established with the die, enabling communications with the die to be effected with reduced or no wirebond or other physical connections. In another aspect of the invention, a source die with RF communication capability communicates with a target die by establishing an RF link with an intermediate RF device. The intermediate RF device has a physical connection, either directly to the target die, or to the substrate which they share, which allows the source die to communicate with the target die. The source and target dies may be on the same or on different substrates. This enables the use of multiple semiconductor dies and substrates in a manner which reduces the required physical connections between them.

DETAILED DESCRIPTION OF THE PREFERRED EMBODIMENTS

Figure 1:
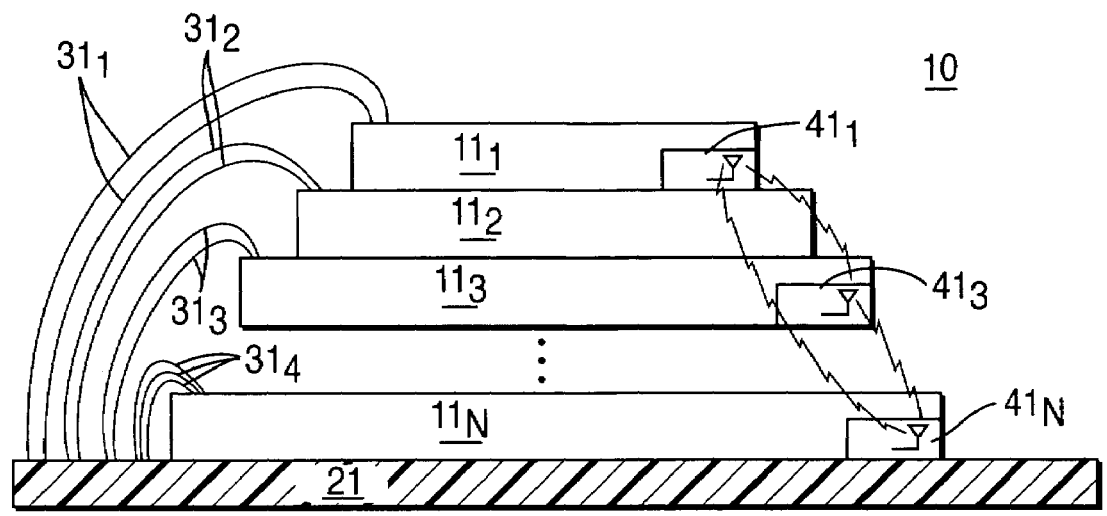
FIG. 1 is a side view of a stacked semiconductor package, schematically showing the use of RF transceivers to establish communication links between stacked dies.

FIG. 1 is a side view of a multi-chip module 10 in which a plurality of dies $11_1$, $11_2$, $11_3$, $11_N$ are shown in a stacked relationship. The bottom of the die $11_N$ is shown as mounted on a package substrate 21. As depicted, the specific number, N, of dies $11_1$, $11_2$, $11_3$, $11_N$ can vary. Although, the stacking of the dies $11_1$, $11_2$, $11_3$, $11_N$ is shown as precluding mounting more than one of the dies $11_1$, $11_2$, $11_3$, $11_N$ directly on the same package substrate 21. In other embodiments, multiple dies can be stacked directly on the substrate 21. A plurality of wirebond connections $31_1$, $31_2$, $31_3$, $31_N$ are shown, in which the stacked dies $11_1$, $11_2$, $11_3$, $11_N$ are wire connected to the package substrate 21. The wirebond connections $31_1$, $31_2$, $31_3$, $31_N$ are established at some point during assembly, so that if for some reason one of the dies $11_1$, $11_2$, $11_3$, $11_N$ is changed, the wirebonding must be re-executed.

Some dies $11_1$, $11_3$, $11_N$ include an RF transceiver $41_1$, $41_3$, $41_N$. For simplicity, the transceivers $41_1$, $41_3$, $41_N$ are depicted on an opposite side of each die $11_1$, $11_2$, $11_3$, $11_N$ from the bond pads. In practice, typically, the transceivers $41_1$, $41_3$, $41_N$ will be on a surface of each die $11_1$, $11_2$, $11_3$, $11_N$ adjacent to the bondpads as well as separate from the bondpads. As illustratively shown, not all the dies $11_2$ may include RF transceivers.

The RF transceivers $41_1$, $41_3$, $41_N$ are capable of RF communication with closely adjacent transceivers, such as the other transceivers $41_1$, $41_3$, $41_N$ on the near-by dies $11_1$, $11_3$, $11_N$. The transceivers $41_1$, $41_3$, $41_N$ include modulator/demodulator circuits, which facilitate communications between the dies $11_1$, $11_3$, $11_N$.

In the configuration shown, the bottom die $11_N$, while equipped with RF transceiver $41_N$, is not able to communicate with the package substrate 21 by use of RF transmissions, although in other embodiments the substrate may have the RF transceiver or both may have the transceiver. Conveniently as shown, this die $11_N$ is mounted adjacent to the substrate 21 and is able to use hardwire connections for communications with the substrate 21. Such hardwire connections can be the wirebond connections $31_1$, $31_2$, $31_3$, $31_N$ shown, or can be any other convenient form of connection. In the case of the communication between the substrate 21 and the adjacent die $11_N$ being hardwired connections, the RF transceivers $41_1$, $41_3$, $41_N$ are used to establish further communication links with other dies $11_1$, $11_3$, $11_N$.

Figure 2:
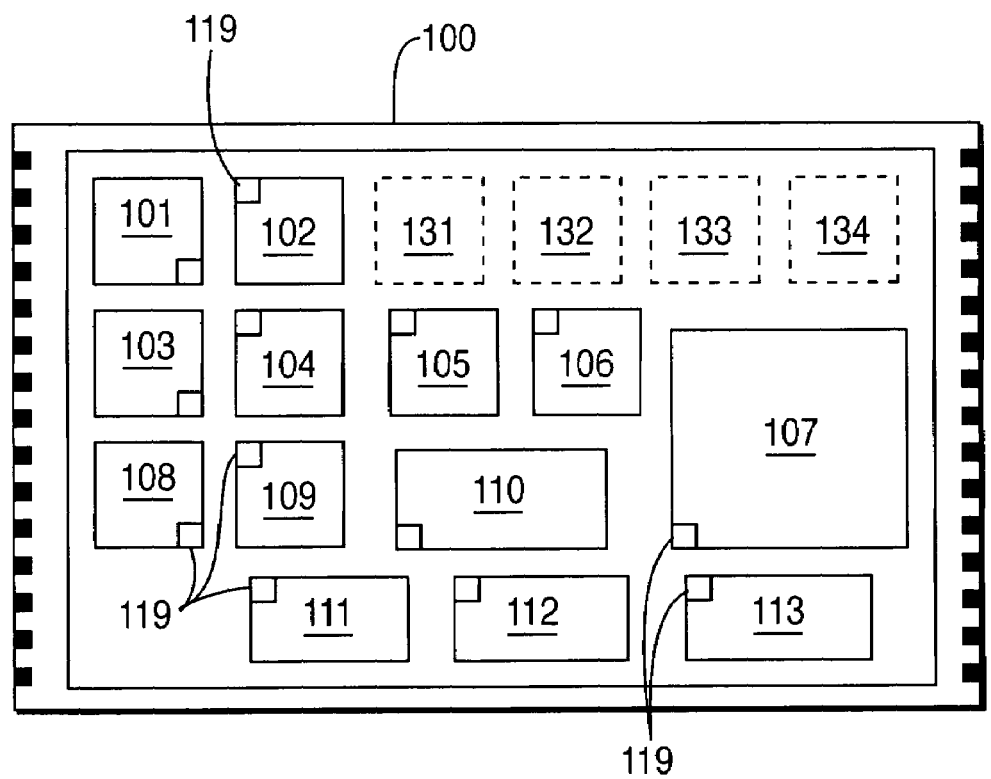
FIG. 2 is a top view of a multi chip module, schematically showing the use of RF transceivers to establish communications links between semiconductor dies.
Figure 1:
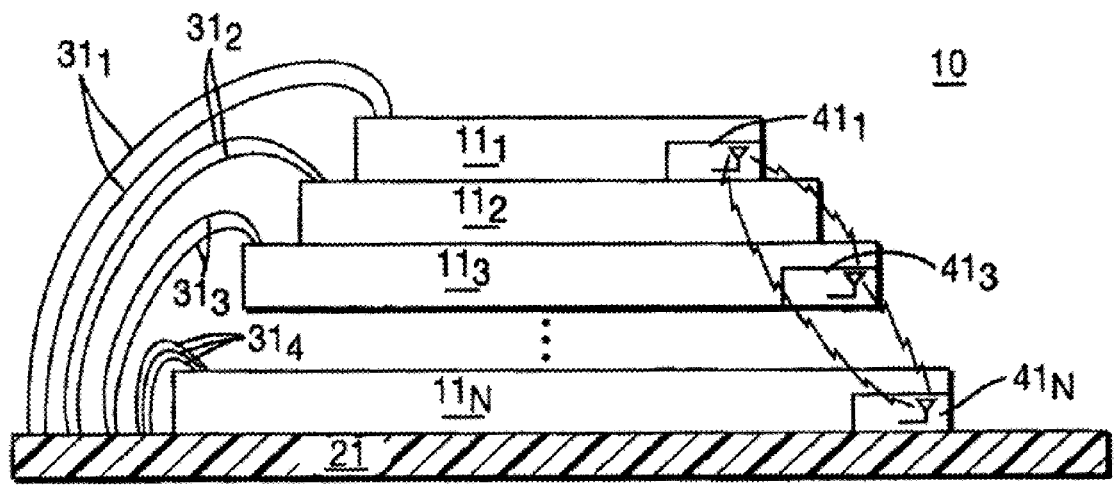
Figure 2:
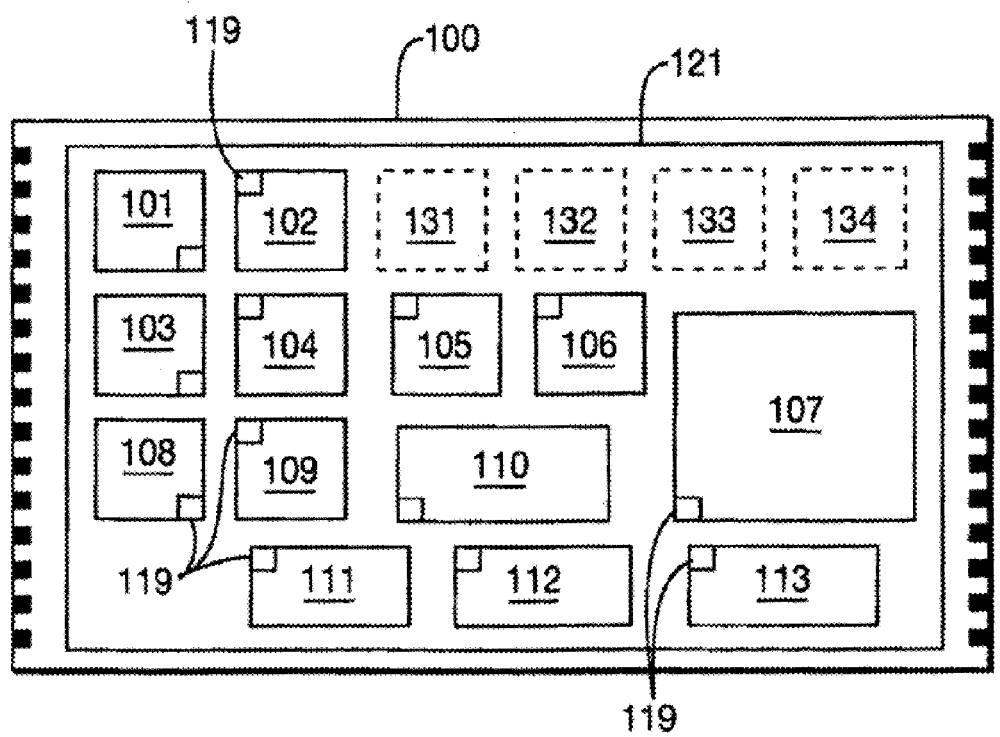

FIG. 2 is top view of a multi-chip module (MCM), in which a semiconductor package 100 is used to hold a plurality of semiconductor dies 101-113. Each die 101-113 may include an RF transceiver 119. The dies 101-113 are each depicted as mounted directly onto a substrate 121 of the MCM 100, although it is one or more of the dies may be positioned in a stacked arrangement. As a result of the direct mounting of the dies 101-113, it is possible to provide direct connections to the mounting substrate 121, and this direct mounting is used for power connections (such as $v_{ss}$, $v_{cc}$). It is also possible to directly connect the signal connections for each individual die 101-113 by use of hardwire techniques. Such connection requires the connection configuration of the dies 101-113 to be established prior to configuring such hardwire connections.

Unused spaces 131-134 are illustratively depicted in the configuration of the MCM 100. It is possible to provide additional dies in those spaces 131-134. The use of RF transceivers permits the additional dies to communicate with the original set of dies 101-113 for which the module 100 was configured, thereby eliminating a requirement to provide separate configurations for the additional dies. The use of RF connections between the dies allows added flexibility in the interaction facilitating more flexible hardware designs. Additionally, the flexible hardware design is more readily software configurable, since the RF connections can be more readily changed than traditional hardware connections. In alternate embodiments, the RF transceivers on the dies can be utilized to provide RF links between multi-chip modules or even single chip modules (module sets). Preferably, the RF transceivers have a limited range to maintain a small footprint and low power consumption. Accordingly, typically, the modules are in close proximity. However, by sacrificing the small footprint and low power consumption, these distances between the module sets can be increased.

What is claimed is:

1. A semiconductor die stack including at least two radio frequency (RF) components, operatively connected to circuitry on the die stack, the RF components configured to establish at least one radio communication link between each other.

2. A semiconductor die stack as in claim 1 wherein at least one RF component is a transmitter.

3. A semiconductor die stack as in claim 1 wherein at least one RF component is a receiver.

4. A semiconductor die stack as in claim 1 wherein at least one RF component is a transceiver.

5. A communication system between semiconductor dies comprising:
   a plurality of semiconductor dies;
   an RF transceiver on at least two of the semiconductor dies, each of said RF transceivers providing a communication capability with at least one other one of said RF transceivers, and each RF transceiver operatively connected to circuitry on its respective die, wherein the dies having the RF transceivers communicate with at least one other die having said communication capability.

6. A communication system between semiconductor dies comprising:
   a plurality of semiconductor dies, each with at least one RF component, each RF component operatively connected to circuitry on its respective die, whereby each RF component provides a communication capability with at least one other RF component; and
   a plurality of substrates, each substrate supporting at least one die with an RF component, whereby the RF component on one substrate communicates with the RF component on at least one other substrate.

7. The system of claim 6 wherein a first die with RF component on a first substrate includes a hardwire signal connection with said first substrate, and a second die with RF component on a second substrate communicates via RF communications with said first die, whereby the second die establishes a signal to said first substrate.

8. The system of claim 6 wherein a source die with RF component on a first substrate communicates via RF communications with an intermediate die with RF component on a second substrate, wherein the intermediate die has a hardwire signal connection with a target die, whereby the source dies establishes a signal to the target die.

* * * * *

UNITED STATES PATENT AND TRADEMARK OFFICE
CERTIFICATE OF CORRECTION

PATENT NO. : 7,304,374 B2
APPLICATION NO. : 11/176748
DATED : December 4, 2007
INVENTOR(S) : John David Kaewell, Jr.

It is certified that error appears in the above-identified patent and that said Letters Patent is hereby corrected as shown below:

IN THE DRAWINGS

At FIG. 2, at top, between elements 100 & 119, add element 121 with connecting line to mounting substrate. As shown in the attached page.

IN THE SPECIFICATION

At column 3, line 3, after the word "although", delete "it is".

Signed and Sealed this

Twenty-ninth Day of July, 2008

JON W. DUDAS
*Director of the United States Patent and Trademark Office*